United States Patent [19]

Sandroff et al.

[11] Patent Number: 5,213,985
[45] Date of Patent: May 25, 1993

[54] TEMPERATURE MEASUREMENT IN A PROCESSING CHAMBER USING IN-SITU MONITORING OF PHOTOLUMINESCENCE

[75] Inventors: Claude J. Sandroff; Francoise S. Sandroff, both of Tinton Falls, N.J.

[73] Assignee: Bell Communications Research, Inc., Livingston, N.J.

[21] Appl. No.: 703,909

[22] Filed: May 22, 1991

[51] Int. Cl.⁵ .................. H01L 21/66; C30B 7/00
[52] U.S. Cl. ................................. 437/8; 156/601; 156/626; 374/131; 374/161
[58] Field of Search ................. 156/601, 626, 627; 374/131, 161; 437/8

[56] References Cited

U.S. PATENT DOCUMENTS

| | | | |
|---|---|---|---|
| 4,819,658 | 4/1989 | Kolodner | 374/161 |
| 4,890,933 | 1/1990 | Amith et al. | 374/161 |
| 5,118,200 | 1/1992 | Kirillov et al. | 374/161 |

OTHER PUBLICATIONS

"Temperature Dependence of the Energy Gap in Semiconductors", Y. P. Varshni, Physica 34, pp. 149–154, 1967.

"Temperature Dependence of the Energy Gap in GaAs and GaP", M. B. Panish et al., J. Appl. Phys., vol. 40, No. 1, pp. 163–167, Jan. 1969.

"The Standard Thermodynamic Functions for the Formation of Electrons and Holes in Ge, Si, GaAs, and GaP", C. D. Thurmond, J. Electrochem. Soc., vol. 122, No. 8, pp. 1133–1141, Aug. 1975.

Primary Examiner—Olik Chaudhuri
Assistant Examiner—Ramamohan R. Paladugu
Attorney, Agent, or Firm—Leonard Charles Suchyta; James W. Falk

[57] ABSTRACT

A relatively simple optical monitoring technique is utilized to measure temperature within a processing chamber. A III-V direct-bandgap semiconductor is optically excited to emit photoluminescence (PL). Spectral resolution of the emitted PL provides a direct measure of the bandgap of the semiconductor. In turn, the temperature of the semiconductor is derived from the bandgap measurement.

19 Claims, 2 Drawing Sheets

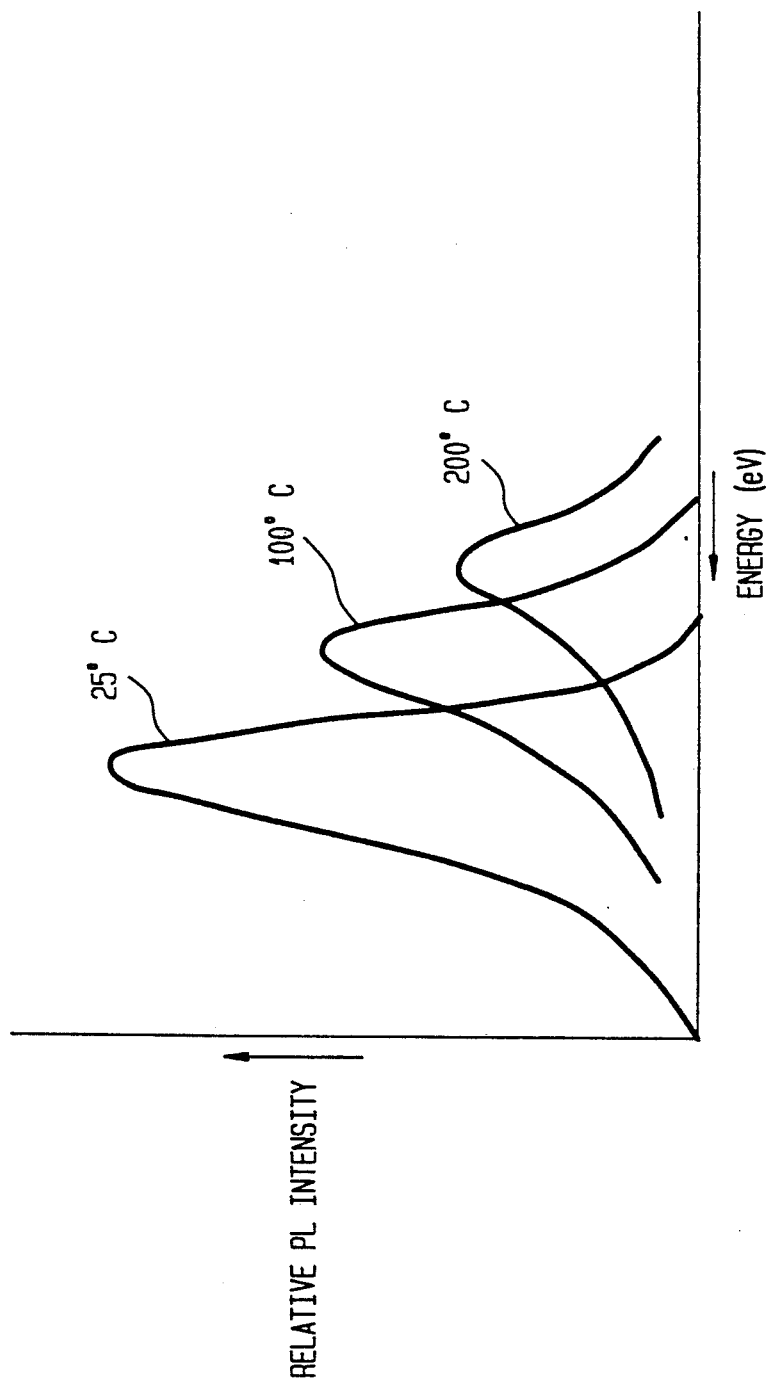

TEMPERATURE MEASUREMENT IN A PROCESSING CHAMBER USING IN-SITU MONITORING OF PHOTOLUMINESCENCE

BACKGROUND OF THE INVENTION

This invention relates to the measurement of a parameter during manufacture of microminiature devices and, more particularly, during fabrication processes in which the temperature of a device substrate is to be measured in-situ.

For many device fabrication processes, it is important to be able to provide an accurate in-situ measurement of the temperature of a substrate (e.g., a wafer) on which a device is being fabricated in a processing chamber. By measuring substrate temperature, it is possible to accurately control temperature-dependent fabrication processes such as, for example, gas-phase etching and epitaxial growth. In that way, the task of making advanced devices with precisely predetermined dimensions and high-performance operating characteristics is facilitated.

Thermocouples of pyrometers are widely used for measuring temperature in a variety of applications. However, neither of these instrumentalities has been found to be suitable for directly measuring substrate temperature during fabrication of advanced devices. Thermocouples often give inaccurate readings due to poor thermal contact with the sample being monitored, while pyrometers typically require frequent and sometimes complicated calibration. Further, alternative temperature-measurement approaches, such as those based on transmission spectroscopy and laser interferometry, have often been found in practice to require unduly complex equipment and/or analysis.

Accordingly, efforts have continued by workers skilled in the art aimed at trying to devise a simple and accurate technique for in-situ temperature measurement of a device substrate. It was recognized that such efforts, if successful, could provide an important basis for lowering the cost of making high-performance microminiature devices.

SUMMARY OF THE INVENTION

In accordance with the principles of the present invention, a direct-bandgap semiconductor is utilized as a monitor in a processing chamber. The semiconductor is optically excited to emit photoluminescense (PL). Spectral resolution of the emitted PL provides a direct measure of the bandgap of the semiconductor. In turn, this measurement is a direct indicator of various properties (e.g. temperature) that cause the bandgap of the semiconductor to change in a predictable way.

BRIEF DESCRIPTION OF THE DRAWING

A complete understanding of the present invention and of the above and other features thereof may be gained from a consideration of the following detailed description presented herein claim in connection with the accompanying drawing, not drawn to scale, in which:

FIG. 3 is a graph showing PL spectra obtained from the FIG. 2 element at various temperatures.

DETAILED DESCRIPTION

Figure 1:
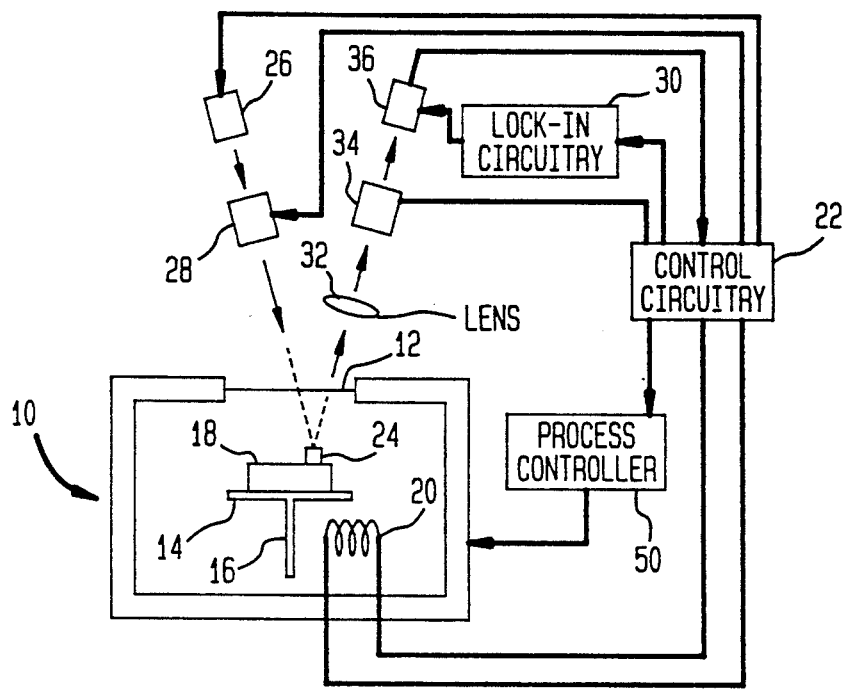
FIG. 1 is a simplified schematic depiction of a specific illustrative measuring system made in accordance with the principles of the present invention.

FIG. 1 shows in simplified form a processing chamber 10 that includes an optically transparent window 12. By way of a specific illustrative example, the chamber 10 is adapted to carry out a standard temperature-dependent processing step in a semiconductor device fabrication sequence. Illustratively, the chamber 10 is designed for conventional molecular beam epitaxy or gas-phase etching.

The chamber 10 shown in FIG. 1 includes a flat pedestal member 14 mounted on a support element 16 which may be designed to rotate the member 14. A device substrate 18 (e.g., a semiconductor wafer) to be processed within the chamber 10 is shown positioned on the member 14.

Element 20 shown in FIG. 1 is designed to heat the interior of the processing chamber 10. The temperature established by the element 20 in the direct vicinity of the member 14 is determined by associated control circuitry 22.

In accordance with the principles of the present invention, the temperature within the processing chamber 10 (FIG. 1) is determined by a temperature sensing element 24. In some cases, the element 24 may actually constitute an integral portion of the device substrate 18. In other cases, such as the particular one illustratively indicated in FIG. 1, the element 24 is mounted on a surface region of the substrate 18. In still other cases, it is feasible to position the element 24 on the member 14 adjacent to the substrate 18.

In accordance with the invention, the temperature sensing element 24 of FIG. 1 comprises a direct-bandgap semiconductor compound of the III-V type. Each of these compounds exhibits a relatively high PL yield and is characterized by a temperature-dependent bandgap. Herein, for purposes of a specific illustrative example, it will be assumed that the element 24 comprises GaAs. This III-V compound is relatively readily available and inexpensive in high-quality form.

In accordance with the present invention, the element 24 shown in FIG. 1 is optically excited to cause charge carriers to move across the bandgap of the GaAs material. As is well known, this will occur if the wavelength of the light incident on the element 24 is selected to exceed the bandgap energy of the target material (GaAs). Further, the number of carriers so moved is determined by the intensity of the incident light.

Illustratively, a laser 26 (FIG. 1) is utilized to excite the temperature sensing element 24. The wavelength of the laser is selected to exceed the bandgap energy of GaAs as the lowest temperature expected to be encountered in the processing chamber 10. In that way, since the bandgap energy of GaAs decreases with increasing temperature, the selected wavelength will be effective to provide the requisite excitation to the element 24 at all higher operating temperatures.

For cases in which the lowest temperature expected to be encountered in the chamber 10 is room temperature, adequate excitation is in practice provided to the element 24 by a 2.5 milliWatt (mW) helium-neon laser operating at 628 nanometers (nm) or by any of the visible lines from an argon-ion laser. In either case, the output of the laser 26 is advantageously propagated through a conventional chopper 28 before being directed at the element 24 via the transparent window 12 of the chamber 10.

In a conventional way well known in the art, the chopper 28, which may, for example, constitute simply a mechanical shutter, functions in conjunction with standard synchronized lock-in circuitry 30 in the detection portion of the system to enhance the signal-to-noise ratio of the overall system. Also, the signal-to-noise ratio of the system can be improved by increasing the power output of the laser 26.

Light from the laser 26 directed at the temperature sensing element 24 is effective to excite the element 24 to emit PL. In turn, the optical signal thereby provided by the excited element 24 is collected by a standard lens 32 and directed to a conventional monochromator 34.

The monochromator 34 of FIG. 1 converts the PL provided by the element 24 into a series of output signals at multiple respective wavelengths. In this way, a spectrally resolved version of the PL from the element 24 is supplied to a standard detector 36 (e.g., a cooled germanium detector). The detector 36 measures the respective intensity of each wavelength component of the optical signals provided by the monochromator 34. In turn, the detector 36 generates electrical signals respectively representative of these intensities. These electrical signals are then supplied to the control circuitry 22 where they provide a basis for determining what the bandgap energy is of the semiconductor material included in the sensing element 24, as will be described in detail later below in connection with FIG. 3. As noted earlier above, the operation of the detector 30 is controlled by the lock-in circuitry 30 to operate in synchronism with the chopper 28, thereby to achieve a relatively high signal-to-noise ratio in the detection process.

Figure 2:
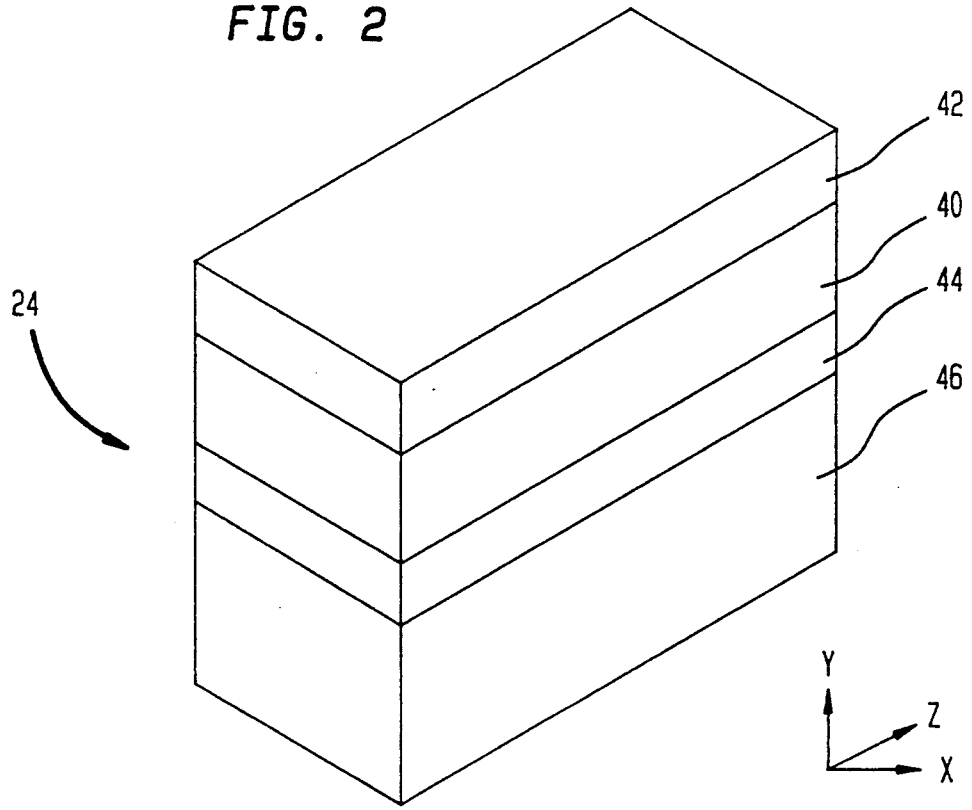
FIG. 2 represents a sensing element of the type included in the FIG. 1 system.

A specific illustrative embodiment of the temperature sensing element 24 shown in FIG. 1 is depicted in FIG. 2. By way of example, the element 24 contains as its active portion a layer 40 of GaAs (a III-V direct-bandgap semiconductor). Advantageously, the layer 40 is sandwiched between lattice-matched layers 42 and 44 each made of a material such as $Al_xGa_{1-x}As$, where x has a value between approximately 0.2 and 0.5. Illustratively, the layers 44, 40 and 42 are successively grown, in that order, by, for example, molecular beam epitaxy on a substrate 46 which is, for example, made of GaAs.

The sandwich structure shown in FIG. 2 is effective to protect the active GaAs layer 40 from degradation due to environmental conditions existing in the processing chamber 10 (FIG. 1). In the depicted structure, exciting light from the laser 26 is absorbed in the topmost capping layer 42 and then transferred to the GaAs layer 40 by a cascade process. In practice, this has been found to improve the radiative PL efficiency of the layer 40 relative to that of an uncapped layer.

In one particular illustrative embodiment, the X and Z dimensions of the substrate 46 (FIG. 2) and of each of the layers 40, 42 and 44 are each a few millimeters (mm). By way of example, the thickness (Y dimension) of the substrate 46 is approximately 0.5 mm. The thickness of each of the layers 42 and 44 is about 0.1 micrometers ($\mu$m), and the thickness of the active GaAs layer 40 is approximately 1.0 $\mu$m. Such an element is relatively convenient to handle and to mount in a processing chamber.

Illustrative PL spectra obtained from the aforedescribed temperature sensing element 24 are shown in FIG. 3. By way of example, spectra are shown in FIG. 3 for only three particular temperatures. As indicated, detected PL intensity decreases with increasing temperature. Illustratively, in the temperature range of 25 degrees Celsius to 450-to-500 degrees Celsius, PL intensities actually decrease by a factor of about 1,000. In practice, this means that temperatures in the range of about 450-to-500 degrees Celsius are the highest ones that can be accurately measured using the particular relatively low-power laser sources specified earlier above. For measuring higher temperatures, say up to approximately 700 degrees Celsius, higher-powered light sources are required to obtain reliably detectable output signals from the herein-described system.

Above the GaAs direct gap, detected PL intensity is proportional to $$(E-E_g)^{\frac{1}{2}} \qquad (1)$$

where E is the photon energy and $E_g$ is the bandgap of GaAs. Thus, spectra such as those shown in FIG. 3 provide an accurate estimate of the bandgap of GaAs. Illustratively, the peak point of each detected spectrum can in practice be utilized as a proportional measure of the GaAs bandgap. As indicated in FIG. 3, the bandgap energy of GaAs (and of other III–V compound semiconductors) decreases with increasing temperature.

Once the bandgap energy of GaAs is determined, the temperature of the sensing element 24 can be accurately calculated by using the Varshni equation [see Y. P. Varshni, *Physica* 39, 149 (1967)] with parameters determined by the data of Casey and Panish [M. B. Panish and H. C. Casey, Jr., *J. Appl. Phys.* 40, 163 (1969)] and Thurmond [C. D. Thurmond, *J. Electrochem. Soc.* 122, 1133 (1975)]:

$$E_g(T) = \frac{1.519 - 5.405 \times 10^{-4} \times T^2}{T + 204} eV \qquad (2)$$

for temperatures in degrees Kelvin.

Advantageously, a conventional processor included in the control circuitry 22 of FIG. 1 is effective to determine the peak point of each detected spectrum and to derive a value of bandgap therefrom. Additionally, the processor is programmed in standard ways to calculate a value of temperature that directly corresponds to the derived temperature-dependent bandgap of the active material of the sensing element 24. In that way, the circuitry 22 provides a direct measure of the temperature in the chamber 10 in the direct vicinity of the device substrate 18.

Illustratively, the specific illustrative GaAs layer 40 described above is undoped. Preliminary studies indicate that if the layer 40 comprises n+-doped GaAs, the aforenoted decrease in PL intensity with increasing temperature will not be as extreme.

In practice, the accurate in-situ measurement of temperature provided by the herein-described system can be utilized in various ways. Thus, for example, the system can be arranged to maintain a relatively constant predetermined temperature on the sample within the processing chamber 10 of FIG. 1. Or temperature-dependent control signals provided by the circuitry 22 can be supplied to a process controller 50 to vary parameters (e.g., pressure, gas composition, etc.) of whatever process is being carried out in the chamber 10.

Also, detected PL intensities from an excited sensing element can be used to monitor properties other than temperature. Various other phenomena cause the bandgap of the active material of the sensing element to change in a predictable way. Illustratively, the described technique is suitable for measuring other substrate or chamber characteristics such as alloy composition (at constant temperature) or the extent of surface and interface recombination during epitaxial growth on the device substrate.

An advantageous variant of the particular illustrative system shown in FIG. 1 utilizes optical fibers both for delivering exciting light directly to the sensing element 24 and for collecting PL from the element. In such a modified system, components such as the transparent window 12 and the lens 32 of FIG. 1 are not required.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, if the support element 16 of FIG. 1 is designed to rotate the flat pedestal member 14, the sensing element 24 can be positioned on the device substrate 18 at the center of rotation of the member 14. Or, if the element 24 is positioned off the center of rotation, optical excitation of the element 24 can be controlled to occur once each rotation as the element moves into the path of the exciting beam.

What is claimed is:

1. A method of measuring a parameter during fabrication of a microminiature device in an epitaxial growth gas phase or vacuum environment in a processing chamber, said method comprising the steps of positioning in said chamber in the direct vicinity of a device being fabricated therein a parameter monitoring element that comprises a III-V direct bandgap semiconductor, optically exciting said element to emit photoluminescence during fabrication of said device, and spectrally resolving the intensity of the photoluminescence emitted by said element to provide a measure of the bandgap energy of said element and thereby also of the parameter of the device fabrication processing being carried out in said chamber.

2. A method as in claim 1 wherein optical excitation of said element is carried out by a laser.

3. A method as in claim 2 wherein spectral resolution is carried out by a monochromator and an intensity detector, said monochromator being positioned in the path of photoluminescence emitted by said element and said detector being positioned to receive the output of said monochromator.

4. A method as in claim 3 wherein the parameter being measured in said chamber in the direct vicinity of the device being fabricated therein is temperature.

5. A method as in claim 4 wherein a chopper is interposed in the path of optical excitation between said laser and said monitoring element, and lock-in circuitry operating in synchronism with said chopper is coupled to said detector for controlling the operation of said detector.

6. A method as in claim 5 wherein said monitoring element includes an active layer capped with a protective layer.

7. A method as in claim 6 wherein said active layer comprises GaAs.

8. A method as in claim 7 wherein said active layer is undoped.

9. A method as in claim 7 wherein said active layer is doped.

10. A method as in claim 7 wherein said active layer is capped with a deposited protective layer comprising $Al_xGa_{1-x}As$, where $0.2 < X < 0.5$.

11. A method as in claim 10 wherein said active layer is deposited on a layer comprising $Al_xGa_{1-x}As$, where $0.2 < X < 0.5$.

12. A method as in claim 11 wherein said second-mentioned layer comprising $Al_xGa_{1-x}As$ is deposited on a substrate layer that comprises GaAs.

13. A method as in claim 4 wherein control circuitry connected to the output of said detector is effective to provide a measure of the temperature in said chamber in the direct vicinity of the device being fabricated therein.

14. A method as in claim 13 wherein energization of a heating element contained within said chamber is controlled by said circuitry.

15. A method as in claim 13 wherein a process controller connected to said chamber is controlled by said circuitry.

16. A method for in-situ measurement of temperature in an epitaxial growth gas phase or vacuum environment in a chamber, said method comprising the steps of optically exciting a sensing element positioned in said chamber to cause said element to emit photoluminescence, said element comprising III-V direct-bandgap semiconductor, spectrally resolving the intensity of the photoluminescence emitted by said element to provide a representation of the bandgap of said element, and processing said representation to obtain therefrom a measure of the temperature of said sensing element.

17. A method of measuring a parameter of a device in a gas phase or vacuum environment within a semiconductor growth processing chamber comprising the steps of positioning within said chamber a parameter monitoring element that comprises a III-V direct bandgap semiconductor, optically exciting said element to emit photoluminescence, and spectrally resolving the intensity of the photoluminescence emitted by said element to provide a measurement of the bandgap energy of said element and thereby also of the parameter of the device.

18. A method as in claim 17 wherein the optical excitation of said element results from impingement thereon of laser energy and wherein the spectral resolution is carriers out by a monochromator and an intensity detector, the photoluminescense from said element impinging on said monochromator which then drives said intensity detector.

19. A method as in claim 18 wherein the parameter being measured is temperature.

* * * * *